United States Patent
Mailhe et al.

(10) Patent No.: US 9,633,455 B1
(45) Date of Patent: Apr. 25, 2017

(54) DICTIONARY-FREE MR PARAMETER INFERENCE FOR FINGERPRINTING RECONSTRUCTION

(71) Applicant: Siemens Healthcare GmbH, Munich (DE)

(72) Inventors: Boris Mailhe, Plainsboro, NJ (US); Mariappan Nadar, Princeton, NJ (US); Xiao Chen, Somerset, NJ (US); Qiu Wang, Princeton, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 14/965,765

(22) Filed: Dec. 10, 2015

(51) Int. Cl.
*G06T 11/00* (2006.01)

(52) U.S. Cl.
CPC ....... *G06T 11/008* (2013.01); *G06T 2211/412* (2013.01)

(58) Field of Classification Search
USPC .......................................... 382/128
See application file for complete search history.

(56) References Cited

U.S. PATENT DOCUMENTS

| 6,275,038 B1* | 8/2001 | Harvey | G01R 33/56563 |
| | | | 324/307 |
| 6,556,695 B1* | 4/2003 | Packer | A61B 5/02007 |
| | | | 382/128 |
| 6,996,261 B2* | 2/2006 | deCharms | A61B 5/055 |
| | | | 378/4 |
| 2008/0200799 A1* | 8/2008 | Willard | A61K 49/124 |
| | | | 600/420 |
| 2011/0044525 A1* | 2/2011 | Ohishi | A61B 6/4014 |
| | | | 382/132 |
| 2013/0338484 A1* | 12/2013 | Huang | G01R 33/4804 |
| | | | 600/411 |
| 2014/0296700 A1* | 10/2014 | Gulani | G01R 33/3614 |
| | | | 600/414 |
| 2015/0287222 A1* | 10/2015 | Zhao | G01R 33/5619 |
| | | | 382/131 |

* cited by examiner

*Primary Examiner* — Ishrat I Sherali

(57) ABSTRACT

A method of generating Magnetic Resonance (MR) parameter maps includes creating one or more parameter maps, each respective parameter map comprising initial parameter values associated with one of a plurality of MR parameters. A dynamical update process is performed over a plurality of time points. The dynamical update process performed at each respective time point includes applying a randomized pulse sequence to subject using an MR scanner to acquire a k-space dataset. This randomized pulse sequence is configured to excite a distinct range of values associated with the plurality of MR parameters. The dynamical update process further includes applying a reconstruction process to the k-space dataset to generate an image and using a tracking process to update the one or more parameter maps based on the randomized pulse sequence and the image.

20 Claims, 3 Drawing Sheets

DICTIONARY-FREE MR PARAMETER INFERENCE FOR FINGERPRINTING RECONSTRUCTION

TECHNOLOGY FIELD

The present invention relates generally to methods, systems, and apparatuses for performing Magnetic Resonance Imaging (MRI) Parameter Inference using Magnetic Resonance Fingerprinting reconstruction techniques. The disclosed techniques may be applied to reduce scan time and reconstruction time in various MM applications.

BACKGROUND

In Magnetic Resonance Imaging (MRI), an object is subjected to a high-strength constant ambient field and an RF pulse sequence is applied. The scanner measures the resulting magnetization in a transverse plane. The transient trajectory depends on, among other things, the tissue parameters associated with the object (e.g., longitudinal relaxation time, transverse relaxation time, and proton density). Traditionally, a pulse sequence is designed to generate contrast by emphasizing a single parameter. Thus, to get a qualitative analysis of the object for all the parameters, there must be multiple, successive acquisitions. The pulse sequence must be carefully designed and acquisitions separated to ensure independence of successive measurements. As a result, the total scan time must increase substantially to ensure that sufficient measurements have been acquired.

Magnetic Resonance Fingerprinting (MRF) is a technique which addresses these issues by replacing the sequence design with one that continuously generates contrast with different parameters emphasis such that all the quantitative parameters may be acquired. In MRF, instead of exciting the system such that it's always in the same state, the state varies based on different excitations (flip angles, repetition times). Depending on all the parameters involved in a particular acquisition, the variation of the magnetization trajectory will be different. Following all the acquisitions, the various magnetization trajectories can be matched to recover the original parameters.

One conventional MRF technique is referred to as direct MRF. This technique uses a spiral readout acquisition and reconstructs one image per readout. The acquisition is highly undersampled and results in heavy undersampling artifacts in the images. Briefly, a Fourier transformation is applied to the acquired data to produce a set of images. For each voxel in the images, the technique determines a static set of parameters that fit the magnetization over time. Fitting is performed by comparing time curves with a dictionary of simulations. The technique itself is computationally and time intensive because the dictionary must be recomputed if the pulse sequence changes. Also, this technique is non-iterative and the resulting parameter maps can still show undersampling artifacts.

Another conventional MRF technique is iterative MRF. For a given sequence, the map of all possible parameters by the simulation function is a low-dimensional manifold. To reconstruct the image, a magnetization map in the manifold is determined that is compatible with the measurements, as well as the parameters that generated it. A projected gradient descent algorithm is applied where the gradient step decreases the error form measurements and the projection step projects magnetization back onto the manifold. This technique reduces undersampling artifacts compared to the direct MRF reconstruction technique described above. However, the projection is still performed by matching with a dictionary generated from sequence-dependent simulations.

Aside from the drawbacks set forth above, MRF techniques which are dependent on a dictionary have disadvantages which limit their applicability across real-world scenarios. For example, when a dictionary is constructed, there is an assumption that the underlying parameters remain constant or substantially similar throughout the acquisition, ignoring any motion that may occur in the region of interest. As a result, a dictionary-based MRF system cannot handle situations where a subject moves during imaging. Similarly, dictionary-based MRF systems are ill-suited to clinical applications such as cardiac imaging where motion is inherent and must be accounted for in order to provide accurate results. Accordingly, it is desired to provide techniques for acquiring MR parameter maps which provide the benefits of MRF without the problems associated with dictionary-based implementations.

SUMMARY

Embodiments of the present invention address and overcome one or more of the above shortcomings and drawbacks, by providing methods, systems, and apparatuses related to a dictionary-free Magnetic Resonance (MR) parameter inference for MRF reconstruction, leading to superior scan speedup compared to conventional MRF techniques. In contrast to conventional systems, the techniques described herein utilize probabilistic tracking algorithms to estimate the parameter change over time.

According to some embodiments, a method of generating Magnetic Resonance (MR) parameter maps includes creating one or more parameter maps, each respective parameter map comprising initial parameter values associated with one of a plurality of MR parameters. A dynamical update process is performed over a plurality of time points. The dynamical update process performed at each respective time point includes applying a randomized pulse sequence to subject using an MR scanner to acquire a k-space dataset. This randomized pulse sequence is configured to excite a distinct range of values associated with the plurality of MR parameters. The dynamical update process further includes applying a reconstruction process to the k-space dataset to generate an image and using a tracking process to update the one or more parameter maps based on the randomized pulse sequence and the image. Some embodiments of the method further comprise updating the reconstruction process based on the one or more parameter maps. The reconstruction process may then apply an optimization process to the k-space dataset and the one or more parameter maps are used to update ground truth information used by the optimization process.

The tracking process used in the aforementioned method may use a filter to determine a one-dimensional time series for each voxel included in the image. This filter may be, for example, an extended Kalman filter, an unscented Kalman filter, or a particle filter. In some embodiments, the tracking process uses a parallel computing system to determine the one-dimensional time series for multiple voxels in parallel during each respective time point of the dynamical update process. The k-space data may be acquired, for example, using a spiral trajectory or a variable spiral trajectory.

According to other embodiments, an article of manufacture for generating MR parameter maps includes a non-transitory, tangible computer-readable medium holding computer-executable instructions for performing the aforementioned method, with or without the additional features discussed above.

According to other embodiments of the present invention, a system for generating MR parameter maps comprises an MR scanner and a central control computer. The MR scanner includes a plurality of coils configured to acquire a plurality of k-space datasets representative of tissue properties of a subject. The central computer is configured to create one or more parameter maps, with each respective parameter map comprising initial parameter values associated with one of a plurality of MR parameters associated with tissue properties of the subject. The central computer is further configured to perform a dynamical update process over a plurality of time points. The dynamical update process performed at each respective time point comprises: applying a randomized pulse sequence to the subject using the MR scanner to acquire a respective k-space dataset; applying a reconstruction process to the respective k-space dataset to generate an image, and using a tracking process to update the one or more parameter maps based on the randomized pulse sequence and the image.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

The following disclosure describes the present invention according to several embodiments directed at methods, systems, and apparatuses related to a dictionary-free Magnetic Resonance (MR) parameter inference for MRF reconstruction. Briefly, an MRF framework is employed which uses tracking algorithms to estimate parameters and magnetization. The disclosed techniques provide faster fitting with lower memory requirements and make iterative reconstruction feasible within clinical settings. The framework is sequence independent, meaning there is not a model to re-train. Additionally, the framework can be extended to incorporate dynamic parameter models for motion, contrast injection, etc.

Figure 1:
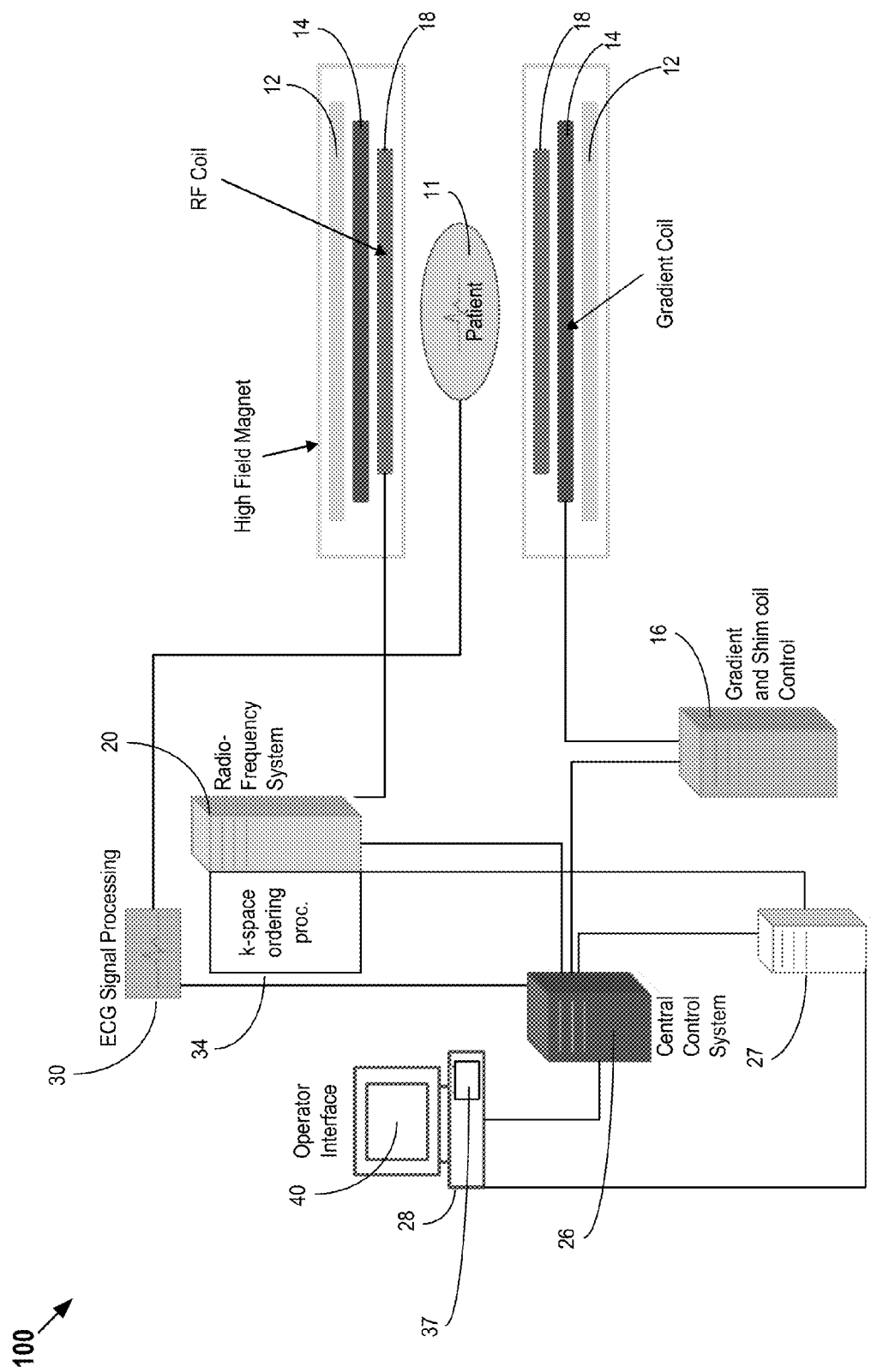
FIG. 1 shows a system for ordering acquisition of frequency domain components representing magnetic resonance image data for storage in a k-space storage array, as used by some embodiments of the present invention.

FIG. 1 shows a system 100 for ordering acquisition of frequency domain components representing MRI data for storage in a k-space storage array, as used by some embodiments of the present invention. In system 100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MRI device magnetic field resulting from patient anatomical variation and other sources. The magnetic field gradients include a slice-selection gradient magnetic field, a phase-encoding gradient magnetic field and a readout gradient magnetic field that are applied to patient 11.

Further radio frequency (RF) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives magnetic resonance signals, i.e., signals from the excited protons within the body. The magnetic resonance signals are detected and processed by a detector within RF module 20 and k-space component processor unit 34 to provide a magnetic resonance dataset to an image data processor for processing into an image. In some embodiments, the image data processor is located in central control unit 26. However, in other embodiments such as the one depicted in FIG. 1, the image data processor is located in a separate unit 27. ECG synchronization signal generator 30 provides ECG signals used for pulse sequence and imaging synchronization. A two or three dimensional k-space storage array of individual data elements in k-space component processor unit 34 stores corresponding individual frequency components comprising a magnetic resonance dataset. The k-space array of individual data elements has a designated center and the individual data elements individually have a radius to the designated center.

A magnetic field generator (comprising coils 12, 14, and 18) generates a magnetic field for use in acquiring multiple individual frequency components corresponding to individual data elements in the storage array. The individual frequency components are successively acquired in an order in which the radius of respective corresponding individual data elements increases and decreases along a trajectory path (e.g., a spiral path) as the multiple individual frequency components are sequentially acquired during acquisition of a magnetic resonance dataset representing a magnetic resonance image. A storage processor in the k-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and, magnetic field gradient change between successively acquired frequency components is substantially minimized.

Central control unit 26 uses information stored in an internal database to process the detected magnetic resonance signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control unit 26 and enables user modification of magnetic resonance imaging signals in substantially real time. Continuing with reference to FIG. 1, display processor 37 processes the magnetic resonance signals to reconstruct one or more images for presentation on display 40, for example. Various techniques may be used for reconstruction. For example, as described in greater detail below, an optimization algorithm is applied to iteratively solve a cost function which results in the reconstructed image.

Using the techniques described herein, the system 100 shown in FIG. 1 may be modified to perform tracking-based parameter estimation using MRF techniques. The conventional dictionary-based system where Markovian inference is performed over the entire temporal evolution at once is inefficient. For example, using an analogy to speech recognition, one would not build a speech recognition system by writing all possible sentences into a huge database. For MR systems, there are known deterministic state evolution models (e.g., the Bloch equations) and known observation models (e.g., transverse magnetization one, with some noise and undersampling artifacts). Thus, as discussed below with respect to FIG. 2, tracking algorithms can be used to estimate parameters and magnetization. This provides many benefits over conventional MRF techniques. For example, using a framework with tracking algorithms, there is lower overall memory requirements because a dictionary does not need to be stored. Moreover, dictionary-based systems have inherent searching and retraining steps that are processor intensive. Such steps are eliminated using the techniques described herein, thus providing fast runtimes for parameter map generation processes. Additionally, a tracking-based system more intuitively fits into iterative reconstruction models; thus allowing easy integration of the disclosed techniques with legacy systems.

Figure 2:
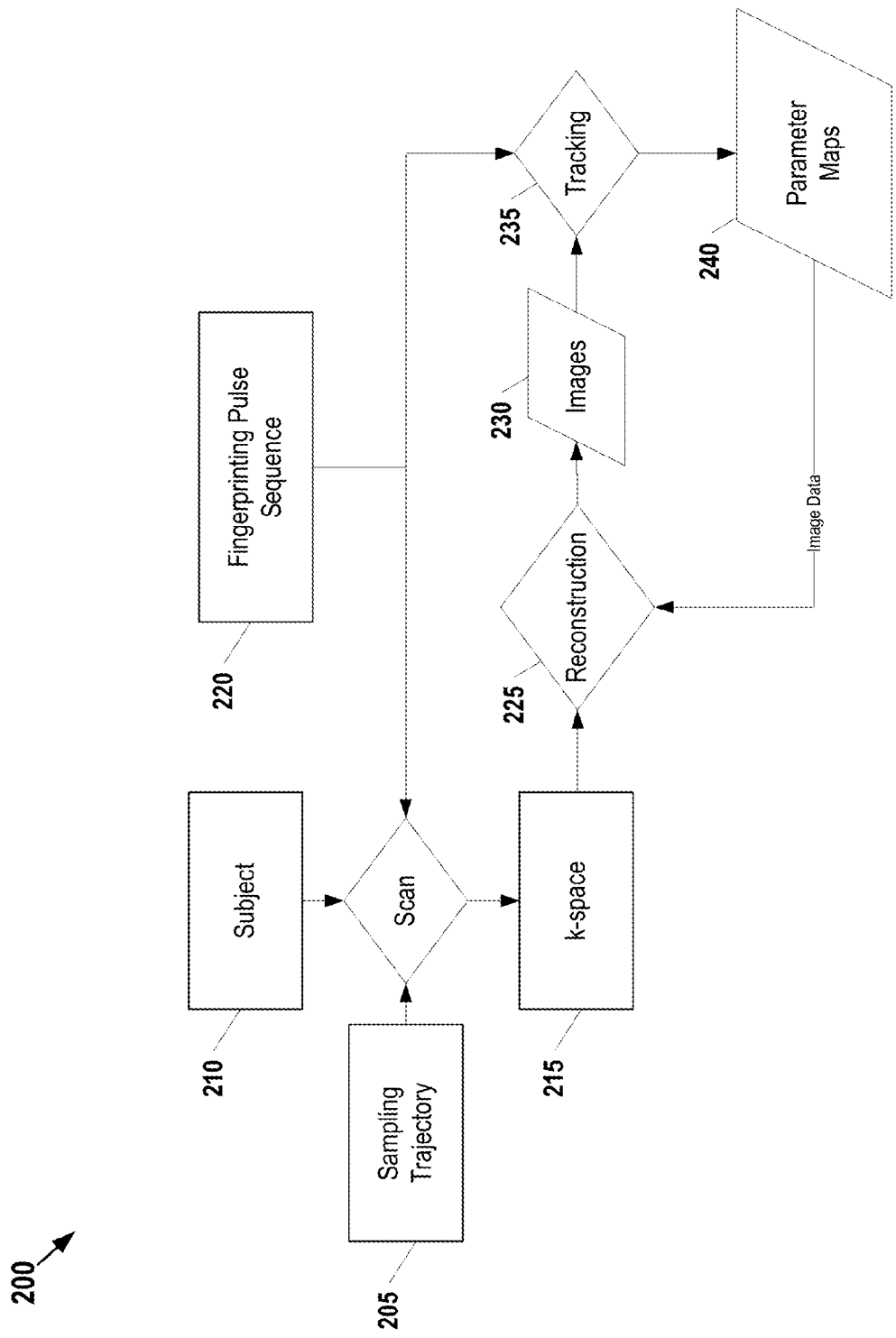
FIG. 2 illustrates a framework for MRF reconstruction with dictionary-free MR parameter inference that may be utilized with the system presented in FIG. 1, according to some embodiments.

FIG. 2 illustrates a framework 200 for dynamical MRF reconstruction with dictionary-free MR parameter inference that may be utilized with the system 100 presented in FIG. 1, according to some embodiments. This framework 200 takes advantage of the fact that the patterns present in the acquired data come from a differential system. In contrast to conventional MRF techniques, tracking algorithms may be used to do matching and refine matching step-by-step. Such algorithms combine existing knowledge about a system with new data using a probability distribution in order to yield an updated estimate of the system that is more accurate than the original knowledge. For example, for the present case, one knows very little about the parameters initially. As a result, the parameters may be modeled using a Gaussian distribution with a very large variance. After measurements are received, the Gaussian may be refined to be a bit narrower. Then, once a measurement is acquired for that time step, it may be used to determine the error in the prediction. Thus, at every step, the mean and variance of the current estimate of a parameter may be determined. As the steps go on, the variance reduces until an accurate description of the parameters emerges.

Using an MRI system (e.g., system 100 in FIG. 1), a Subject 210 is scanned using a Sampling Trajectory 205 and a Fingerprinting Pulse Sequence 220 to yield a k-space Dataset 215. The Sampling Trajectory 205 defines the sampling path through k-space accomplished using gradients that oscillate in a coordinated manner along two in-plane directions. Various trajectories generally known in the art may be used as the Sampling Trajectory 205 including Cartesian and non-Cartesian trajectories (e.g., spiral and variable spiral trajectories).

The Fingerprinting Pulse Sequence 220 is a conventional pulse sequence adapted for MRF reconstruction applications. There is some level of randomization in the pulse sequence to ensure that it excites various contrasts. Thus, it does not reproduce the same contrast over time. In traditional MR pulse sequences, everything is designed to be consistent over time to allow the data to be combined into a consistent k-space dataset which can be used to reconstruct the image. Conversely, the Fingerprinting Pulse Sequence 220 is designed to change over time to disassociate the effects of the different physical parameters. In some embodiments, one parameter of the Fingerprinting Pulse Sequence 220 changes over time, while in other embodiments, multiple parameters change over time. For example, two significant parameters are the flip angle (i.e., how strong the excitation will be in the region of interest) and repetition time (i.e., how long is the period between excitations). Repetition time may be randomized in the Fingerprinting Pulse Sequence 220 over time within a range of values. At the same time as, or as an alternative to, the variation in repetition time, the flip angle may be varied, for example, between values of 0 and 90 degrees.

Following the scan of the Subject 210, Reconstruction 225 is performed on the k-space Dataset 215 to yield Images 230. The Reconstruction 225 may be implemented, for example, as an iteration of a gradient step using the following minimization equation:

$$\min \|y-Ax\|_2^2$$

where A represents the Fourier transform, Sampling Trajectory 205 and/or coil sensitivity maps, y is the k-space Dataset 215, and x represents the Images 230. This equation may be solved various optimization techniques generally known in the art including, for example, alternating direction method of multipliers (ADMM).

Following Reconstruction 225, Tracking Algorithms 235 are used to estimate parameters and magnetization on a per-voxel basis. Each voxel is treated as a one-dimensional time series. The Tracking Algorithms 235 utilize the Fingerprinting Pulse Sequence 220 and the Images 230 to produce Parameter Maps 240. Each of the Tracking Algorithms 235 models the distribution of parameter data as Gaussian data and, in principle, various conventional tracking algorithms may be used by the framework 200. However, due to the non-linear joint evolution of magnetization and parameters, algorithms such as the Kalman filter may be unsuitable in some embodiments without further adjustment to the framework 200. However, non-linear versions of tracking algorithms (e.g., the extended Kalman filter, the unscented Kalman filter, particle filters, etc.), may be used alone or in combination as the Tracking Algorithms 235 to provide an estimate of parameter data. The processing of each of the Tracking Algorithms 235 may likewise be performed using any technique known in the art. For example, in some embodiments, the independence of individual voxels is leveraged to process voxels in parallel (e.g., using a Graphics Processing Unit cluster).

Each of the Parameter Maps 240 produced by the Tracking Algorithms 235 is a quantitative map which presents a particular magnetic parameter in a voxel-wise fashion. Examples of particular parameter maps that may be generated using the framework include T1 relaxation, T2 relaxation, and off-resonance frequency maps. However, it should be noted that, in principle, the framework 200 may be utilized to map any parameter associated with the Subject 210 and measureable using the MR system. Additionally, in contrast to conventional systems, the Parameter Maps 240 may be used to provide time-resolved imaging data. For example, for a cardiac application, time-resolved parameter maps may be developed such that they illustrate changes over the cardiac cycle. Once generated, the Parameter Maps 240 may be utilized to synthesize the two-dimensional image data, which, in turn, is used as feedback to the Reconstruction 225.

The framework 200 presented in FIG. 2 may be augmented in different embodiments with various additional features. For example, the Tracking Algorithms 235 may implement spatial regularization to penalize differences between neighboring parameters. The Tracking Algorithms 235 may also be customized for specific applications, for example, by incorporating tissue-specific models with prior information about possible parameters.

Figure 3:
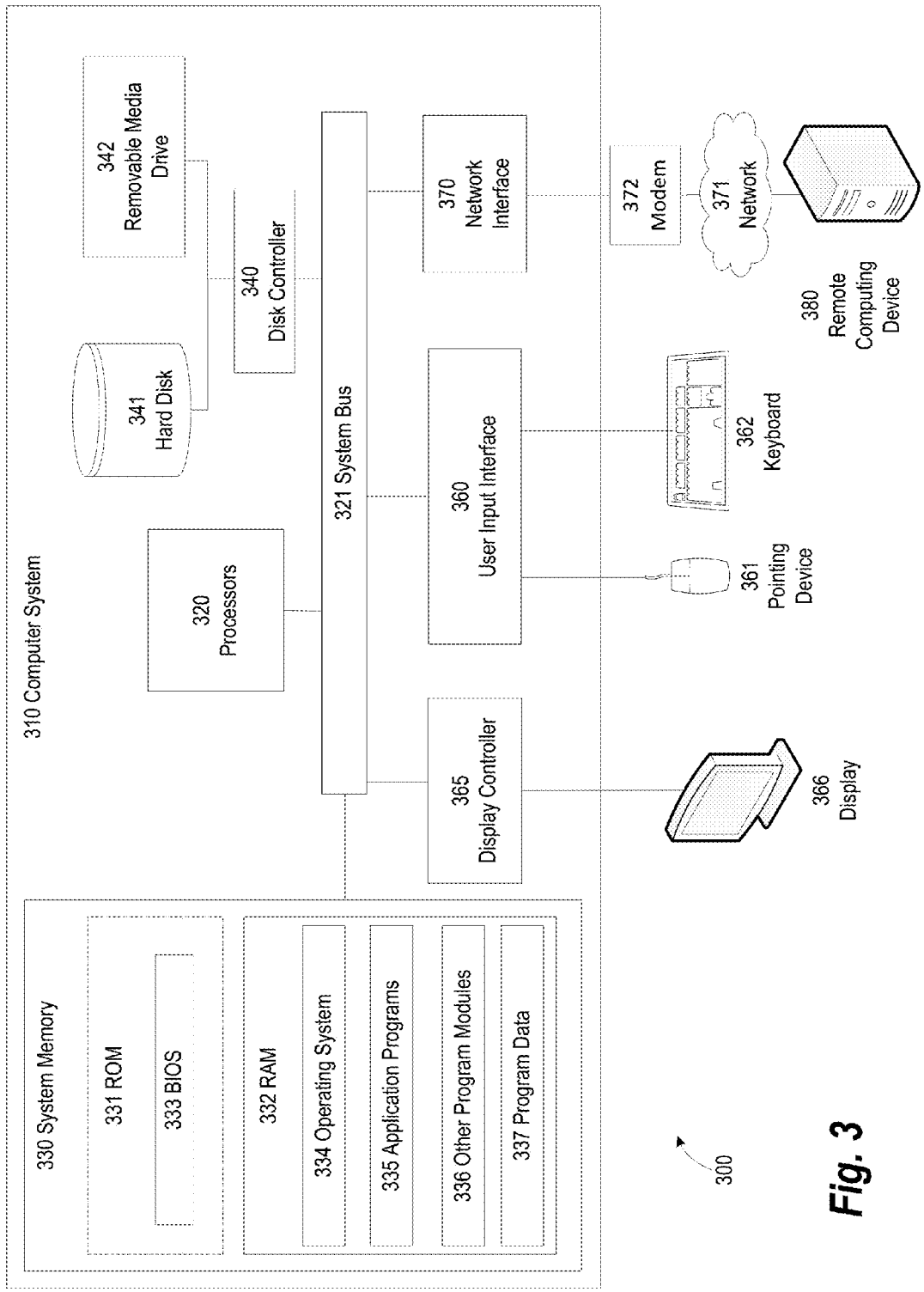
FIG. 3 illustrates an exemplary computing environment within which embodiments of the invention may be implemented.

FIG. 3 illustrates an exemplary computing environment 300 within which embodiments of the invention may be implemented. For example, this computing environment 300 may be used to implement the framework 200 described in FIG. 2 and/or one or more of the components illustrated in the system 100 of FIG. 1. The computing environment 300 may include computer system 310, which is one example of a computing system upon which embodiments of the invention may be implemented. Computers and computing environments, such as computer system 310 and computing environment 300, are known to those of skill in the art and thus are described briefly here.

As shown in FIG. 3, the computer system 310 may include a communication mechanism such as a bus 321 or other communication mechanism for communicating information within the computer system 310. The computer system 310 further includes one or more processors 320 coupled with the bus 321 for processing the information. The processors 320 may include one or more central processing units (CPUs), graphical processing units (GPUs), or any other processor known in the art.

The computer system 310 also includes a system memory 330 coupled to the bus 321 for storing information and instructions to be executed by processors 320. The system memory 330 may include computer readable storage media in the form of volatile and/or nonvolatile memory, such as read only memory (ROM) 331 and/or random access memory (RAM) 332. The system memory RAM 332 may include other dynamic storage device(s) (e.g., dynamic RAM, static RAM, and synchronous DRAM). The system memory ROM 331 may include other static storage device (s) (e.g., programmable ROM, erasable PROM, and electrically erasable PROM). In addition, the system memory 330 may be used for storing temporary variables or other intermediate information during the execution of instructions by the processors 320. A basic input/output system (BIOS) 333 containing the basic routines that help to transfer information between elements within computer system 310, such as during start-up, may be stored in ROM 331. RAM 332 may contain data and/or program modules that are immediately accessible to and/or presently being operated on by the processors 320. System memory 330 may additionally include, for example, operating system 334, application programs 335, other program modules 336 and program data 337.

The computer system 310 also includes a disk controller 340 coupled to the bus 321 to control one or more storage devices for storing information and instructions, such as a hard disk 341 and a removable media drive 342 (e.g., floppy disk drive, compact disc drive, tape drive, and/or solid state drive). The storage devices may be added to the computer system 310 using an appropriate device interface (e.g., a small computer system interface (SCSI), integrated device electronics (IDE), Universal Serial Bus (USB), or FireWire).

The computer system 310 may also include a display controller 365 coupled to the bus 321 to control a display 366, such as a cathode ray tube (CRT) or liquid crystal display (LCD), for displaying information to a computer user. The computer system includes an input interface 360 and one or more input devices, such as a keyboard 362 and a pointing device 361, for interacting with a computer user and providing information to the processors 320. The pointing device 361, for example, may be a mouse, a trackball, or a pointing stick for communicating direction information and command selections to the processors 320 and for controlling cursor movement on the display 366. The display 366 may provide a touch screen interface which allows input to supplement or replace the communication of direction information and command selections by the pointing device 361.

The computer system 310 may perform a portion or all of the processing steps of embodiments of the invention in response to the processors 320 executing one or more sequences of one or more instructions contained in a memory, such as the system memory 330. Such instructions may be read into the system memory 330 from another computer readable medium, such as a hard disk 341 or a removable media drive 342. The hard disk 341 may contain one or more datastores and data files used by embodiments of the present invention. Datastore contents and data files may be encrypted to improve security. The processors 320 may also be employed in a multi-processing arrangement to execute the one or more sequences of instructions contained in system memory 330. In alternative embodiments, hard-wired circuitry may be used in place of or in combination with software instructions. Thus, embodiments are not limited to any specific combination of hardware circuitry and software.

As stated above, the computer system 310 may include at least one computer readable medium or memory for holding instructions programmed according to embodiments of the invention and for containing data structures, tables, records, or other data described herein. The term "computer readable medium" as used herein refers to any medium that participates in providing instructions to the processors 320 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 341 or removable media drive 342. Non-limiting examples of volatile media include dynamic memory, such as system memory 330. Non-limiting examples of transmission media include coaxial cables, copper wire, and fiber optics, including the wires that make up the bus 321. Transmission media may also take the form of acoustic or light waves, such as those generated during radio wave and infrared data communications.

The computing environment 300 may further include the computer system 310 operating in a networked environment using logical connections to one or more remote computers, such as remote computer 380. Remote computer 380 may be a personal computer (laptop or desktop), a mobile device, a server, a router, a network PC, a peer device or other common network node, and typically includes many or all of the elements described above relative to computer system 310. When used in a networking environment, computer system 310 may include modem 372 for establishing communications over a network 371, such as the Internet. Modem 372 may be connected to bus 321 via user network interface 370, or via another appropriate mechanism.

Network 371 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 310 and other computers (e.g., remote computer 380). The network 371 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 371.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

We claim:

1. A method of generating Magnetic Resonance (MR) parameter maps, the method comprising:
   creating one or more parameter maps, each respective parameter map comprising initial parameter values associated with one of a plurality of MR parameters;
   performing a dynamical update process over a plurality of time points, wherein the dynamical update process performed at each respective time point comprises:
   applying a randomized pulse sequence to subject using an MR scanner to acquire a k-space dataset, wherein the randomized pulse sequence is configured to excite a distinct range of values associated with the plurality of MR parameters;
   applying a reconstruction process to the k-space dataset to generate an image; and
   using a tracking process to update the one or more parameter maps based on the randomized pulse sequence and the image.

2. The method of claim 1, further comprising:
   updating the reconstruction process based on the one or more parameter maps.

3. The method of claim 2, wherein the reconstruction process applies an optimization process to the k-space dataset and the one or more parameter maps are used to update ground truth information used by the optimization process.

4. The method of claim 1, wherein the tracking process uses a filter to determine a one-dimensional time series for each voxel included in the image.

5. The method of claim 4, wherein the filter is an extended Kalman filter.

6. The method of claim 4, wherein the filter is an unscented Kalman filter.

7. The method of claim 4, wherein the filter is a particle filter.

8. The method of claim 4, wherein the tracking process uses a parallel computing system to determine the one-dimensional time series for multiple voxels in parallel during each respective time point of the dynamical update process.

9. The method of claim 1, where each k-space data is acquired using a spiral trajectory.

10. The method of claim 1, where each k-space data is acquired using a variable spiral trajectory.

11. An article of manufacture for generating Magnetic Resonance (MR) parameter maps, the article of manufacture comprising a non-transitory, tangible computer-readable medium holding computer-executable instructions for performing a method comprising:

creating one or more parameter maps, each respective parameter map comprising initial parameter values associated with one of a plurality of MR parameters;

performing a dynamical update process over a plurality of time points, wherein the dynamical update process performed at each respective time point comprises:

applying a randomized pulse sequence to subject using an MR scanner to acquire a k-space dataset, wherein the randomized pulse sequence is configured to excite a distinct range of values associated with the plurality of MR parameters;

applying a reconstruction process to the k-space dataset to generate an image; and using a tracking process to update the one or more parameter maps based on the randomized pulse sequence and the image.

12. The article of manufacture of claim 11, wherein the method further comprises:

updating the reconstruction process based on the one or more parameter maps.

13. The article of manufacture of claim 12, wherein the reconstruction process applies an optimization process to the k-space dataset and the one or more parameter maps are used to update ground truth information used by the optimization process.

14. The article of manufacture of claim 11, wherein the tracking process uses a filter to determine a one-dimensional time series for each voxel included in the image.

15. The article of manufacture of claim 14, wherein the filter is an extended Kalman filter.

16. The article of manufacture of claim 14, wherein the filter is an unscented Kalman filter.

17. The article of manufacture of claim 14, wherein the filter is a particle filter.

18. The article of manufacture of claim 14, wherein the tracking process uses a parallel computing system to determine the one-dimensional time series for multiple voxels in parallel during each respective time point of the dynamical update process.

19. The article of manufacture of claim 11, where each k-space data is acquired using a spiral trajectory.

20. A system for generating Magnetic Resonance (MR) parameter maps, the system comprising:

an MR scanner comprising a plurality of coils configured to acquire a plurality of k-space datasets representative of tissue properties of a subject; and a central computer configured to:

create one or more parameter maps, each respective parameter map comprising initial parameter values associated with one of a plurality of MR parameters associated with tissue properties of the subject; and perform a dynamical update process over a plurality of time points, wherein the dynamical update process performed at each respective time point comprises:

applying a randomized pulse sequence to the subject using the MR scanner to acquire a respective k-space dataset, wherein the randomized pulse sequence is configured to excite a distinct range of values associated with the plurality of MR parameters, applying a reconstruction process to the respective k-space dataset to generate an image, and using a tracking process to update the one or more parameter maps based on the randomized pulse sequence and the image.

\* \* \* \* \*